United States Patent
Hai et al.

(10) Patent No.: US 11,864,433 B2
(45) Date of Patent: Jan. 2, 2024

(54) DISPLAY PANEL AND DISPLAY DEVICE

(71) Applicant: BOE TECHNOLOGY GROUP CO., LTD., Beijing (CN)

(72) Inventors: Xiaoquan Hai, Beijing (CN); Xue Dong, Beijing (CN); Lei Wang, Beijing (CN); Xiaochuan Chen, Beijing (CN); Yingzi Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 17/621,758

(22) PCT Filed: Dec. 25, 2020

(86) PCT No.: PCT/CN2020/139453
§ 371 (c)(1),
(2) Date: Dec. 22, 2021

(87) PCT Pub. No.: WO2022/134012
PCT Pub. Date: Jun. 30, 2022

(65) Prior Publication Data
US 2022/0399421 A1 Dec. 15, 2022

(51) Int. Cl.
*G06V 40/13* (2022.01)
*H10K 59/126* (2023.01)
(Continued)

(52) U.S. Cl.
CPC ......... *H10K 59/126* (2023.02); *G06V 10/145* (2022.01); *G06V 40/1318* (2022.01); *H10K 59/65* (2023.02); *G06F 3/0412* (2013.01)

(58) Field of Classification Search
CPC .............. G06K 9/0004; G06V 40/1318; H01L 27/3227; H01L 27/3234
See application file for complete search history.

(56) References Cited

U.S. PATENT DOCUMENTS 10,181,070 B2  1/2019  Smith et al.
2019/0095674 A1 * 3/2019  Ko ................... H01L 31/02327
(Continued)

FOREIGN PATENT DOCUMENTS

CN  106773219 A    5/2017
CN  108878503 A  * 11/2018 ........... H01L 27/322
(Continued)

*Primary Examiner* — Yuzhen Shen
(74) *Attorney, Agent, or Firm* — HOUTTEMAN LAW LLC

(57) ABSTRACT

A display panel is provided to include a substrate; a photoelectric sensing structure on a side of the substrate; a light emitting structure on a side of the photoelectric sensing structure distal to the substrate, and light emitting elements, each of which includes: a first electrode, a light emitting layer, and a second electrode which are successively in a direction distal to the substrate; and a light path structure between the photoelectric sensing structure and the second electrode, and configured to collimate light on a side of the photoelectric sensing structure distal to the substrate and having a propagation direction towards the photoelectric sensing structure; the photoelectric sensing structure and the light emitting structure do not overlap or partially overlap in a direction perpendicular to the substrate; and the light path structure at least partially overlaps the photoelectric sensing structure in the direction. The embodiment also provides a display device.

22 Claims, 9 Drawing Sheets

(51) Int. Cl.
  *G06V 10/145* (2022.01)
  *H10K 59/65* (2023.01)
  *G06F 3/041* (2006.01)

(56) References Cited

U.S. PATENT DOCUMENTS

| | | | | |
|---|---|---|---|---|
| 2020/0394371 | A1* | 12/2020 | Chai | G06F 3/0416 |
| 2021/0359061 | A1* | 11/2021 | Wang | H10K 59/13 |
| 2022/0093668 | A1* | 3/2022 | Kim | G06V 40/1318 |
| 2022/0392976 | A1* | 12/2022 | Wang | H10K 50/865 |
| 2023/0105947 | A1* | 4/2023 | Zhang | G06V 40/13 349/12 |

FOREIGN PATENT DOCUMENTS

| | | | | |
|---|---|---|---|---|
| CN | 109784303 A | | 5/2019 | |
| CN | 109785756 A | * | 5/2019 | ............... G09F 9/30 |
| CN | 111626142 A | * | 9/2020 | ......... G02F 1/13338 |
| CN | 111626142 A | | 9/2020 | |
| CN | 111781755 A | | 10/2020 | |
| CN | 111965881 A | | 11/2020 | |
| CN | 112001337 A | | 11/2020 | |

\* cited by examiner

DISPLAY PANEL AND DISPLAY DEVICE

TECHNICAL FIELD

The present disclosure relates to the display field, and in particular, to a display panel and a display device.

BACKGROUND

In order to reduce a thickness of products, some manufacturers have proposed a technical solution of integrating a photoelectric sensor (e.g. a PIN photodiode) inside a display panel in an In-Cell manner. Specifically, a light-emitting element (such as an organic light-emitting diode) for picture display and a photoelectric sensor for fingerprint identification are respectively formed in a display panel, and the photoelectric sensor receives light reflected by valleys or ridges of a fingerprint and generates corresponding electric signals. Since the reflection at the valleys and the reflection at the ridges are different, the generated electric signals are also different, and thus the valleys and the ridges can be recognized.

However, in practical applications, it is found that light reflected from adjacent valleys or adjacent ridges enters a same photoelectric sensor, i.e., crosstalk of light occurs, and finally, image blurring occurs.

SUMMARY

The present disclosure is directed to at least solve one of the technical problems of the prior art, and provides a display panel and a display device.

In a first aspect, an embodiment of the present disclosure provides a display panel, including:
- a substrate;
- a photoelectric sensing structure on a side of the substrate;
- a light emitting structure on a side of the photoelectric sensing structure distal to the substrate, and including a plurality of light emitting elements, each of the plurality of light emitting elements including: a first electrode, a light emitting layer, and a second electrode which are successively in a direction distal to the substrate; and
- a light path structure between the photoelectric sensing structure and the second electrode, and configured to collimate light which is on a side of the photoelectric sensing structure distal to the substrate and has a propagation direction proximal to the photoelectric sensing structure; wherein
- the photoelectric sensing structure and the light emitting structure do not overlap or partially overlap in a direction perpendicular to the substrate; and
- the light path structure at least partially overlaps the photoelectric sensing structure in the direction perpendicular to the substrate.

In some embodiments, the light path structure has a plurality of light transmission channels, and
- an angle, between a propagation direction of light emitted from the light transmission channels to the photoelectric sensing structure and a normal of a plane where the substrate is located, ranges from 0° to 72°.

In some embodiments, an angle, between the propagation direction of light emitted from the light transmission channels to the photoelectric sensing structure and the normal of the plane where the substrate is located, ranges from 0° to 20°.

In some embodiments, the photoelectric sensing structure includes a plurality of photoelectric sensors, each of which corresponds to at least one of the light transmission channels.

In some embodiments, each of the plurality of photoelectric sensors corresponds to n of the light transmission channels, where $1 \leq n \leq 10$, and n is a positive integer.

In some embodiments, the light path structure includes at least one light shielding layer with a plurality of light transmission holes, wherein the light transmission holes define the light transmission channels.

In some embodiments, the at least one light shielding layer includes: a first light shielding layer and a second light shielding layer on a side of the first light shielding layer distal to the substrate, and a light transmission layer is between the first light shielding layer and the second light shielding layer; the first light shielding layer has first light transmission holes in an array, the second light shielding layer has second light transmission holes in one-to-one correspondence with the first light transmission holes, and the first light transmission hole and a corresponding one of the second light transmission holes define the light transmission channel.

In some embodiments, the at least one light shielding layer further includes at least one third light shielding layer between the first light shielding layer and the second light shielding layer, wherein a light transmission layer is between every two adjacent light shielding layers;
- the third light shielding layer has third light transmission holes in one-to-one correspondence with the first light transmission holes, and the first light transmission hole and a corresponding one of the second light transmission holes and a corresponding one of the third light transmission holes define the light transmission channel.

In some embodiments, the number of the at least one third light shielding layer is 1.

In some embodiments, an orthographic projection of the second light transmission hole on the substrate and an orthographic projection of the first light transmission hole on the substrate have substantially the same shape, and
- a ratio of an area of the orthographic projection of the first light transmission hole on the substrate to an area of the orthographic projection of the second light transmission hole on the substrate ranges from 0.2 to 1.

In some embodiments, an orthographic projection of the third light transmission hole on the substrate and an orthographic projection of the first light transmission hole on the substrate have substantially the same shape, and have substantially the same area.

In some embodiments, orthographic projections of the first light transmission hole, the second light transmission hole corresponding to the first light transmission hole, and the third light transmission hole corresponding to the first light transmission hole on the substrate at least partially overlap each other.

In some embodiments, orthographic projections of the first light transmission hole and the second light transmission hole corresponding to the first light transmission hole on the substrate completely overlap;
- orthographic projections of the first light transmission hole and the third light transmission hole corresponding to the first light transmission hole on the substrate at least partially overlap.

In some embodiments, a region where orthographic projections of the first light transmission hole and the third light transmission hole corresponding to the first light transmission hole on the substrate overlap with each other has a square shape.

In some embodiments, orthographic projections of the first light transmission hole, the second light transmission hole corresponding to the first light transmission hole, and the third light transmission hole corresponding to the first light transmission hole on the substrate are respectively a first orthographic projection, a second orthographic projection and a third orthographic projection;

the first orthographic projection, the second orthographic projection and the third orthographic projection have substantially the same area and have a shape of a square, and one of any two sides intersecting with each other of the square extends along a first direction, and the other one extends along a second direction;

distances in the first direction and in the second direction between a center of the first orthographic projection and a center of the third orthographic projection are equal to each other.

In some embodiments, side lengths of the first orthographic projection, the second orthographic projection and the third orthographic projection are all D, the distances in the first direction and in the second direction between the center of the first orthographic projection and the center of the third orthographic projection are all T, a thickness of the light path structure is H, and a collimation light-receiving angle θ of the light transmission channel in the light path structure satisfies:

$$\theta = \arctan((D-T)/H),$$

where D ranges from 4 μm to 10 μm; T ranges from 1 μm to 3 μm;
the collimation light-receiving angle θ ranges from 10° to 20°.

In some embodiments, arrangement periods of the first light transmission holes, the second light transmission holes, and the third light transmission holes are equal to each other and are P, a thickness of the first light shielding layer is h1, a thickness of the second light shielding layer is h2, a thickness of the third light shielding layer is h3, a thickness of the light transmission layer between the first light shielding layer and the third light shielding layer is H1, and a thickness of the light transmission layer between the second light shielding layer and the third light shielding layer is H2, D, T, H, P, h1, h2, h3, H1 and H2 satisfy:

$$H/(P+D) \leq (h1+h3+H1)/(D+T) \leq (h2+H2)/(P-T).$$

In some embodiments, P is in the range of 5 μm to 20 μm;
h1 is in the range of 1 μm to 3 μm;
h2 is in the range of 1 μm to 3 μm;
h3 is in the range of 1 μm to 3 μm;
H1 is in the range of 0.5 μm to 4 μm;
H2 is in the range of 0.5 μm to 4 μm.

In some embodiments, a second planarization layer is on a side of the photoelectric sensing structure distal to the substrate and a material of the second planarization layer includes: a light shielding material;
the second planarization layer is multiplexed as the first light shielding layer.

In some embodiments, a first passivation layer is between the second planarization layer and the photoelectric sensing structure.

In some embodiments, a pixel definition layer is on a side of the second planarization layer distal to the substrate, the pixel definition layer has a pixel opening therein, the light emitting layer is in the pixel opening, the second electrode is on a side of the pixel definition layer distal to the substrate, and a material of the pixel definition layer includes: a light shielding material;
the pixel definition layer is multiplexed as the second light shielding layer.

In some embodiments, a filter layer is between the second electrode and the pixel definition layer, and fills the second light transmission hole in the pixel definition layer, and the filter layer is configured to filter out non-visible light.

In some embodiments, a filter layer is between the first light shielding layer and the second light shielding layer, and is configured to filter out non-visible light;
the filter layer is multiplexed as at least one light transmission layer.

In some embodiments, a filling layer is between the second electrode and the pixel definition layer, fills the second light transmission holes in the pixel definition layer, and
a spacer dam surrounding the pixel opening is between the filling layer and the second electrode.

In some embodiments, a spacer dam is between the second electrode and the pixel definition layer, fills the second light transmission holes in the pixel definition layer and surrounds the pixel opening.

In some embodiments, the filter layer includes: an infrared filter layer configured to filter out infrared light.

In some embodiments, at least one third light shielding layer is between the first light shielding layer and the second light shielding layer, a material of the third light shielding layer includes a black resin material.

In some embodiments, at least one third light shielding layer is between the first light shielding layer and the second light shielding layer, a material of the third light shielding layer includes: a metal material.

In some embodiments, a second passivation layer is between the third light shielding layer and the light transmission layer on a side of the third light shielding layer proximal to the substrate and closest to the third light shielding layer.

In some embodiments, the photoelectric sensing structure includes a plurality of photoelectric sensors, each of which includes a third electrode, a photoelectric conversion layer, and a fourth electrode which are successively in a direction distal to the substrate;
the display panel further includes: a driving circuit layer between the substrate and the photoelectric sensing structure, and including first transistors electrically connected to the light emitting elements and second transistors electrically connected to the photoelectric sensors;
a drain of the first transistor is electrically connected to the first electrode in the corresponding one of the light emitting elements, and a drain of the second transistor is electrically connected to the third electrode in the corresponding one of the photoelectric sensors.

In some embodiments, the driving circuit layer includes an active layer, a first gate insulating layer, a first gate conductive layer, a second gate insulating layer, a second gate conductive layer, an interlayer dielectric layer, a first source drain conductive layer, and a first planarization layer, which are sequentially stacked along a direction distal to the substrate;
a second source drain conductive layer is on a side of the first planarization layer distal to the substrate, and includes the third electrode.

In some embodiments, a bias voltage line is on a side of the photoelectric sensing structure distal to the substrate, is electrically connected to a fourth electrode, and is in the same layer as the first electrode.

In some embodiments, an encapsulation layer and a cover plate are on a side of the second electrode distal to the substrate, and the cover plate is on a side of the encapsulation layer distal to the substrate.

In some embodiments, a touch functional layer is between the encapsulation layer and the cover plate.

In some embodiments, a circular polarizer is between the encapsulation layer and the cover plate.

In some embodiments, the photoelectric sensing structure includes a plurality of photoelectric sensors, and an orthographic projection of the photoelectric sensor on the substrate does not overlap an orthographic projection of the light emitting element on the substrate;
- the substrate includes a plurality of first pixel regions in an array and a plurality of second pixel regions in an array, and the first pixel regions and the second pixel regions are alternately provided in a row direction and a column direction; and
- the light emitting element is in the first pixel region, and the photoelectric sensor is in the second pixel region.

In some embodiments, the light emitting element is an organic light emitting diode.

In a second aspect, an embodiment of the present disclosure further provides a display device, including: any one of the display panels as provided in the first aspect above and an outer frame for fixing the display panel.

DETAIL DESCRIPTION OF EMBODIMENTS

Figure 1:
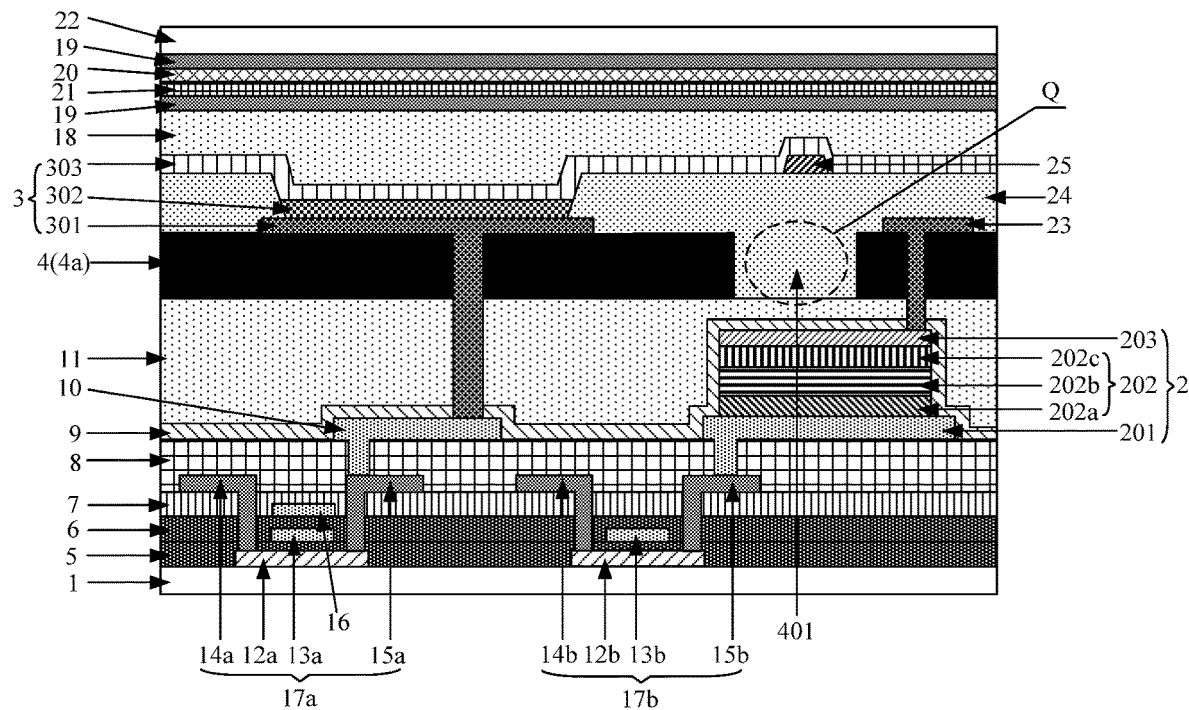
FIG. 1 is a schematic cross-sectional diagram of a display panel provided in an embodiment of the present disclosure.

In order to make one of ordinary skill in the art understand the technical solution of the present disclosure better, a display panel, a manufacturing method thereof, and a display device provided in the present disclosure are described in detail below with reference to the accompanying drawings.

Example embodiments will be described more fully hereinafter with reference to the accompanying drawings, but may be embodied in different forms and should not be construed as being limited to the embodiments set forth herein. Rather, these embodiments are provided so that this disclosure will be thorough and complete, and will fully convey the scope of the present disclosure to one of ordinary skill in the art. Shapes and sizes of various elements in the drawings are not to scale and are merely schematic representations of the present disclosure.

The terminology used herein is for the purpose of describing particular embodiments only and is not intended to limit the present disclosure. As used herein, singular forms "a", "an" and "the" are intended to include the plural forms as well, unless the context clearly indicates otherwise. It will be further understood that the terms "comprises" and/or "be made of" when used in this specification, specify the presence of stated features, entities, steps, operations, elements, and/or components, but do not preclude the presence or addition of one or more other features, entities, steps, operations, elements, components, and/or groups thereof. Embodiments of the present disclosure and features of the embodiments may be combined with each other without conflict with each other.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense, unless expressly so defined herein.

FIG. 1 is a schematic cross-sectional diagram of a display panel provided in an embodiment of the present disclosure. As shown in FIG. 1, the display panel provided in the embodiment of the present disclosure is a display panel having a display function and a fingerprint identification function, and includes:
- a substrate 1; specifically, the material of the substrate 1 may be polyimide (PI) or glass.
- a photoelectric sensing structure located on one side of the substrate 1; the photoelectric sensing structure will be described in detail below.
- a light emitting structure located on a side of the photoelectric sensing structure distal to the substrate 1, and including: a plurality of light emitting elements 3, each of which includes: a first electrode 301, a light emitting layer 302, and a second electrode 303 which are successively arranged in a direction distal to the substrate 1.

a light path structure 4 located between the photoelectric sensing structure and the second electrode 303, and configured to collimate light which is on a side of the photoelectric sensing structure distal to the substrate and has a propagation direction proximal to the photoelectric sensing structure.

In a direction perpendicular to the substrate, the photoelectric sensing structure and the light emitting structure do not overlap or partially overlap; the light path structure 4 at least partially overlaps the photoelectric sensing structure in the direction perpendicular to the substrate.

In the embodiment of the present disclosure, by disposing the light path structure 4 between the photoelectric sensing structure and the second electrode 303, so as to collimate the light emitted from one side to the other side of the photoelectric sensing structure, the problem of crosstalk of light reflected by adjacent valleys/ridges may be effectively improved, or even completely eliminated, so as to improve the imaging definition.

In some embodiments, the light emitting element 3 is a top emission type light emitting element 3; the first electrode 301 is a reflective electrode, and may be made of conductive materials with better reflective performance, such as metal materials of copper (Cu), aluminum (Al), titanium (Ti), molybdenum (Mo), etc., or alloy materials; the second electrode 303 is a transparent electrode, and may be made of conductive materials with better transmission performance, such as transparent metal oxide materials of Indium Tin Oxide (ITO), Indium Zinc Oxide (IZO), Gallium Zinc Oxide (GZO), and the like.

In some embodiments, specifically, the light emitting element 3 may be an organic light emitting diode (OLED), in which the light emitting layer 302 is an organic light emitting layer 302; the first electrode 301 may serve as an anode of the organic light emitting diode, and the second electrode 303 may serve as a cathode of the organic light emitting diode. An organic functional film layer such as a hole injection layer or a hole transport layer may be selectively provided between the first electrode 301 and the light emitting layer 302, and an organic functional film layer such as an electron injection layer or an electron transport layer may be selectively provided between the second electrode 303 and the light emitting layer 302.

The photoelectric sensing structure includes: a plurality of photoelectric sensors 2, each of which includes: a third electrode 201, a photoelectric conversion layer 202, and a fourth electrode 203 which are successively provided in a direction distal to the substrate 1. In some embodiments, the photoelectric sensor includes: a PIN photodiode or a PN photosensitive diode, and the operation state of the photoelectric sensor may be controlled by controlling the voltage applied between the third electrode 201 and the fourth electrode 203. The photoelectric conversion layer 202 includes a P-type semiconductor layer (e.g., P-type Si layer) 202c and an N-type semiconductor layer (e.g., N-type Si layer) 202a, which are stacked, or includes a P-type semiconductor layer 202c, an intrinsic semiconductor layer (e.g., intrinsic Si layer) 202b, and an N-type semiconductor layer 202a, which are stacked. As an example, the intrinsic semiconductor layer 202B is of an a-Si material, the P-type semiconductor layer 202c is of an a-Si material doped with B ions, and the N-type semiconductor layer 202a is of an a-Si material doped with P ions.

In some embodiments, the fourth electrode 203 is a transparent electrode, and may be made of a transparent metal oxide material such as indium tin oxide, indium zinc oxide, or gallium zinc oxide. The first electrode 301 is a metal electrode, and may be made of a metal material such as copper, aluminum, titanium, or molybdenum, or an alloy material.

In some embodiments, the light path structure 4 has a plurality of light transmission channels Q, and there is an angle ranging from 0° to 72° between a propagation direction of light emitted from the light transmission channels Q to the photoelectric sensing structure and a normal of a plane where the substrate 1 is located. That is, light emitted from one side to the other side of the light path structure may only pass through the light transmission channels Q in the light path structure 4, and the light that may be emitted from the light transmission channels Q is light with a small angle.

In the embodiment of the present disclosure, the light transmission channel Q refers to a channel through which light may pass through the light path structure 4, and the light transmission channel Q may play a role in collimating light emitted to the photoelectric sensing structure at various angles, so that the light emitted from the light transmission channel Q is within a certain angle range, and a difference between a maximum angle and a minimum angle in the angle range is a light-receiving angle of the light transmission channel Q. The light transmission channel Q will be described in detail below with reference to specific examples.

Figure 2:
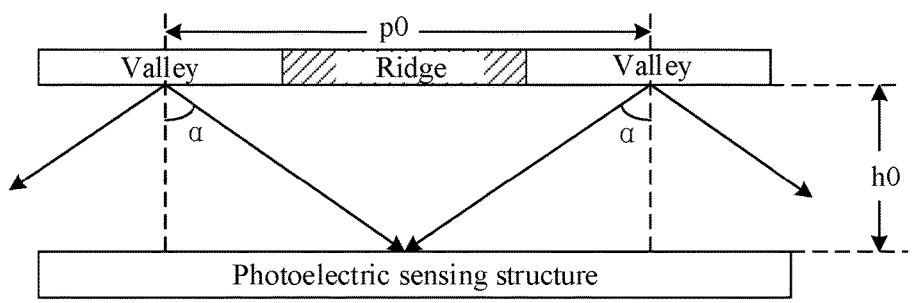
FIG. 2 is a schematic diagram of light reflected from adjacent valleys in an embodiment of the present disclosure.

FIG. 2 is a schematic diagram of light reflected from adjacent valleys in an embodiment of the present disclosure. As shown in FIG. 2, the light reflected by the adjacent valleys has no crosstalk. That is, a light emitting angle α at which valleys and ridges may be distinguished from each other satisfies: tan α=p0/2*h0; wherein p0 is a distance between centers of adjacent valleys/ridges on the fingerprint, and p0 is generally 0.3 mm to 0.45 mm; h0 is a distance between the fingerprint and the photoelectric sensing structure, and for a ultrathin product, h0 is generally 0.4 mm to 0.65 mm. p0/2*h0 may be calculated to be in the range of 0.23 to 0.56 by taking p0 in the range of 0.3 mm to 0.45 mm and h0 in the range of 0.4 mm to 0.65 mm. Taking a case where p0/2*h0 is 0.25 as an example, the critical angle α≈14.04° where crosstalk occurs may be calculated. That is, light having a reflection angle greater than the critical angle α≈14.04° are all crosstalk light.

Based on the foregoing analysis, light reflected by adjacent valleys/ridges with crosstalk occurring is light with a large angle, and the specific critical angles are related to the magnitudes of p0 and h0. In the embodiment of the present disclosure, by providing the light path structure 4, the incident light with a large angle may be reflected and therefore effectively filtered and eliminated (part of light with a small angle may also be filtered and eliminated because it does not reach the light transmission channel Q or reach the light transmission channel Q but does not pass through the light transmission channel Q), so that the problem of crosstalk occurring in the light reflected by adjacent valleys/ridges may be effectively improved, or even completely eliminated, and the imaging definition may be improved.

In some embodiments, the light path structure 4 is configured such that there is an angle ranging from 0° to 20° between a propagation direction of light emitted from the light transmission channels Q to the photoelectric sensing structure and a normal of a plane where the substrate 1 is located. In this way, the design may be suitable for an ultrathin display panel, and the problem of crosstalk of reflected light may be substantially eliminated.

Figure 3A:
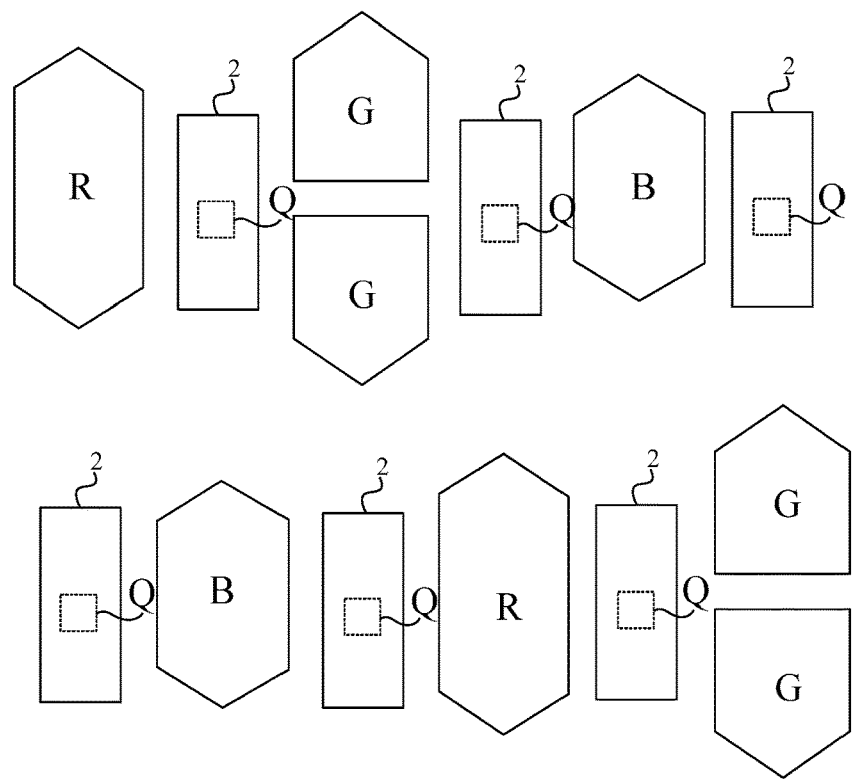
FIG. 3a is a schematic diagram illustrating a positional relationship among a light emitting device, a photoelectric sensor and a light transmission channel in an embodiment of the present disclosure.
Figure 3B:
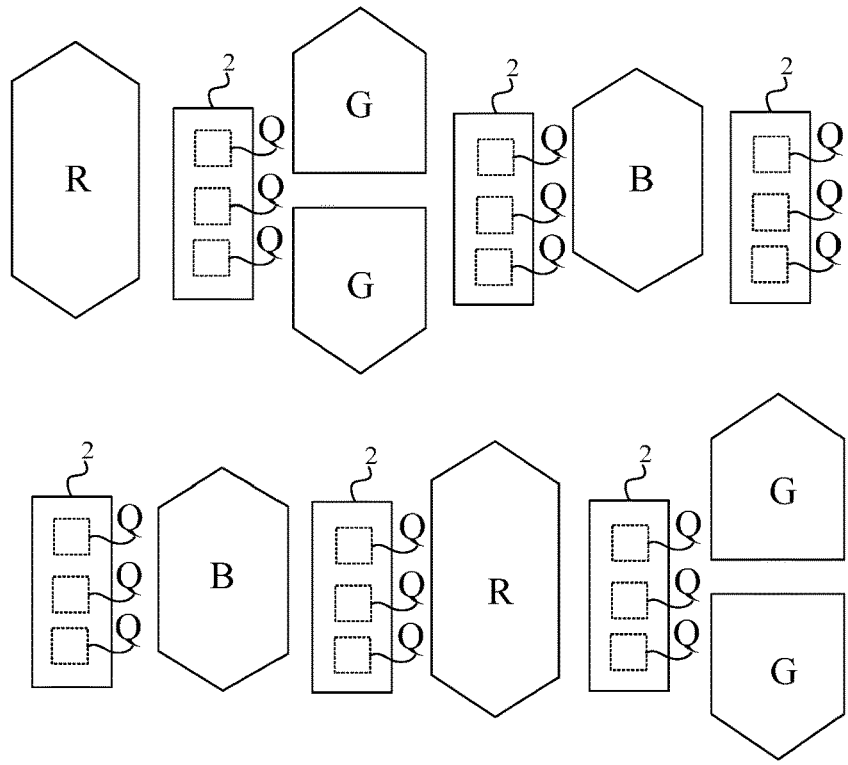
FIG. 3b is a schematic diagram illustrating another positional relationship among a light emitting device, a photoelectric sensor and a light transmission channel in an embodiment of the present disclosure.

FIG. 3a is a schematic diagram illustrating a positional relationship among a light emitting device, a photoelectric sensor and a light transmission channel in an embodiment of the present disclosure; FIG. 3b is a schematic diagram illustrating another positional relationship among a light emitting device, a photoelectric sensor and a light transmission channel in an embodiment of the present disclosure. As shown in FIG. 3a and FIG. 3b, in some embodiments, each photoelectric sensor 2 corresponds to one or more light transmission channels Q, and one light transmission channel corresponds to one photoelectric sensor 2.

The light transmission channel Q corresponds to the photoelectric sensor 2, which, specifically, means that when light is emitted from one side to the other side of the light path structure, the light emitted from a certain light transmission channel Q may only reach the photoelectric sensor 2 corresponding to this light transmission channel Q but cannot reach other photoelectric sensors 2. In the embodiment of the present disclosure, one light transmission channel Q may correspond to only one photoelectric sensor 2, and one photoelectric sensor 2 may correspond to one or more light transmission channels Q.

In a case where an area of a section (also called as a cross section) of the light transmission channel Q parallel to the plane where the substrate 1 is located is constant, the more the number of the light transmission channels Q corresponding to one photoelectric sensor 2 is, the larger an illumination area of the photoelectric sensor 2 is, and the more the fingerprint identification is facilitated. However, when the number of the light transmission channels Q corresponding to one photoelectric sensor 2 reaches a certain upper limit, since an area occupied by one photoelectric sensor 2 is limited, as the number of the light transmission channels Q corresponding to the photoelectric sensor 2 continues to increase, the cross-sectional area of the light transmission channel Q parallel to the plane where the substrate 1 is located needs to be decreased; the smaller the cross-sectional area of the light transmission channel Q parallel to the plane where the substrate 1 is located is, the greater the difficulty in manufacturing the light path structure 4 is. Comprehensively taking the illumination area of the photoelectric sensor 2 and the difficulty in manufacturing the light path structure 4 into consideration, in the embodiment of the present disclosure, one photoelectric sensor 2 corresponds to n light transmission channels Q, where 1≤n≤10, and n is a positive integer.

In some embodiments, an orthographic projection of the photoelectric sensor 2 on the substrate 1 does not overlap an orthographic projection of the light emitting element 3 on the substrate 1.

Further, the substrate 1 includes a plurality of first pixel regions arranged in an array and a plurality of second pixel regions arranged in an array, and the first pixel regions and the second pixel regions are alternately arranged in a row direction and a column direction; the light emitting element 3 is located in the first pixel regions, and the photoelectric sensor 2 is located in the second pixel regions.

Further, the plurality of first pixel regions includes: a red pixel region, a green pixel region and a blue pixel region. A light emitting element 3 in the red pixel region is a red light emitting element R that emits red light, a light emitting element 3 in the green pixel region is a green light emitting element G that emits green light, and a light emitting element 3 in the blue pixel region is a blue light emitting element B that emits blue light.

With continued reference to FIGS. 3a and 3b, as one example, one red light emitting element R is disposed in one red pixel region, two independent green light emitting elements G are disposed in one green pixel region and arranged in a column direction, and one blue light emitting element B is disposed in one blue pixel region.

In some embodiments, an orthographic projection of the red light emitting element R on the substrate 1 is a convex hexagon, and an orthographic projection of the blue light emitting element B on the substrate 1 is a hexagon; an orthographic projection of the green light emitting element G on the substrate 1 is a convex pentagon, orthographic projections of the two green light emitting elements G in the same green pixel region on the substrate 1 are axisymmetric with respect to each other, and the symmetry axis is parallel to the row direction.

It should be noted that, the light emitting element 3 shown in FIGS. 3a and 3b includes the red light emitting element R, the green light emitting element G, and the blue light emitting element B. Orthographic projections of the red light emitting element R and the blue light emitting element B on the substrate 1 are a convex hexagon, and the orthographic projection of the green light emitting element G on the substrate 1 is a convex pentagon, which is only exemplary and does not limit the technical solution of the present disclosure. In the embodiment of the present disclosure, the light emitting element 3 may also be a light emitting element emitting light of other color (e.g., a yellow light emitting element emitting yellow light, a white light emitting element emitting white light, etc.), and the orthographic projection of the light emitting element 3 on the substrate 1 may also be other shape (e.g., a rectangle, a circle, an ellipse, etc.).

In some embodiments, the light path structure 4 includes: at least one light shielding layer which is provided with a plurality of light transmission holes, and the light transmission hole defines the light transmission channel Q. The light path structure in the present disclosure will be described in detail below with reference to the accompanying drawings.

Figure 4:
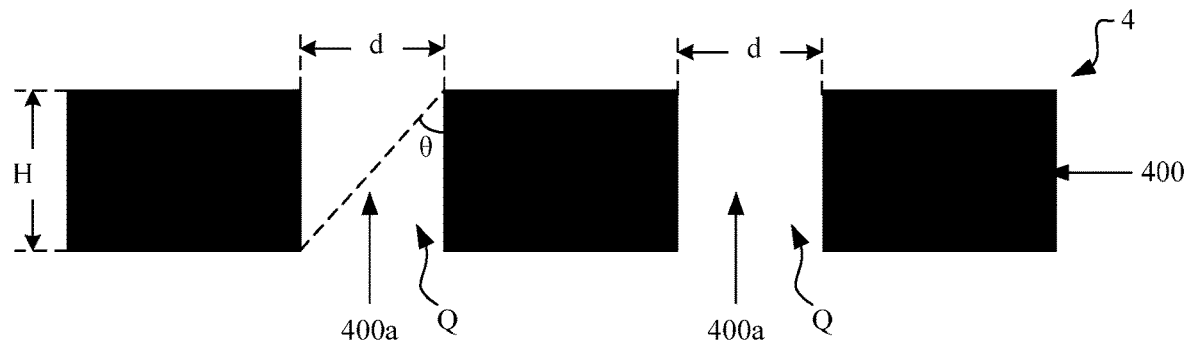
FIG. 4 is a schematic cross-sectional diagram of a light path structure in the display panel shown in FIG. 1.

FIG. 4 is a schematic cross-sectional diagram of a light path structure in the display panel shown in FIG. 1. As shown in FIG. 1 and FIG. 4, in some embodiments, the light path structure 4 includes: one light shielding layer 400 which is provided with a plurality of light transmission holes 400a, and one light transmission hole 400a defines one light transmission channel Q. An aperture of the light transmission hole 400a is d, and a thickness of the light shielding layer is H, a light outgoing angle of the light transmission channel Q ranges from 0° to arctan(d/H). That is, the light-receiving angle θ of the light transmission channel Q is arctan(d/H). If a predetermined critical angle at which crosstalk occurs is α, to substantially eliminate the crosstalk of the reflected light, it is required to satisfy arctan(d/H)≤α, that is, d/H≤tan α.

Figure 5:
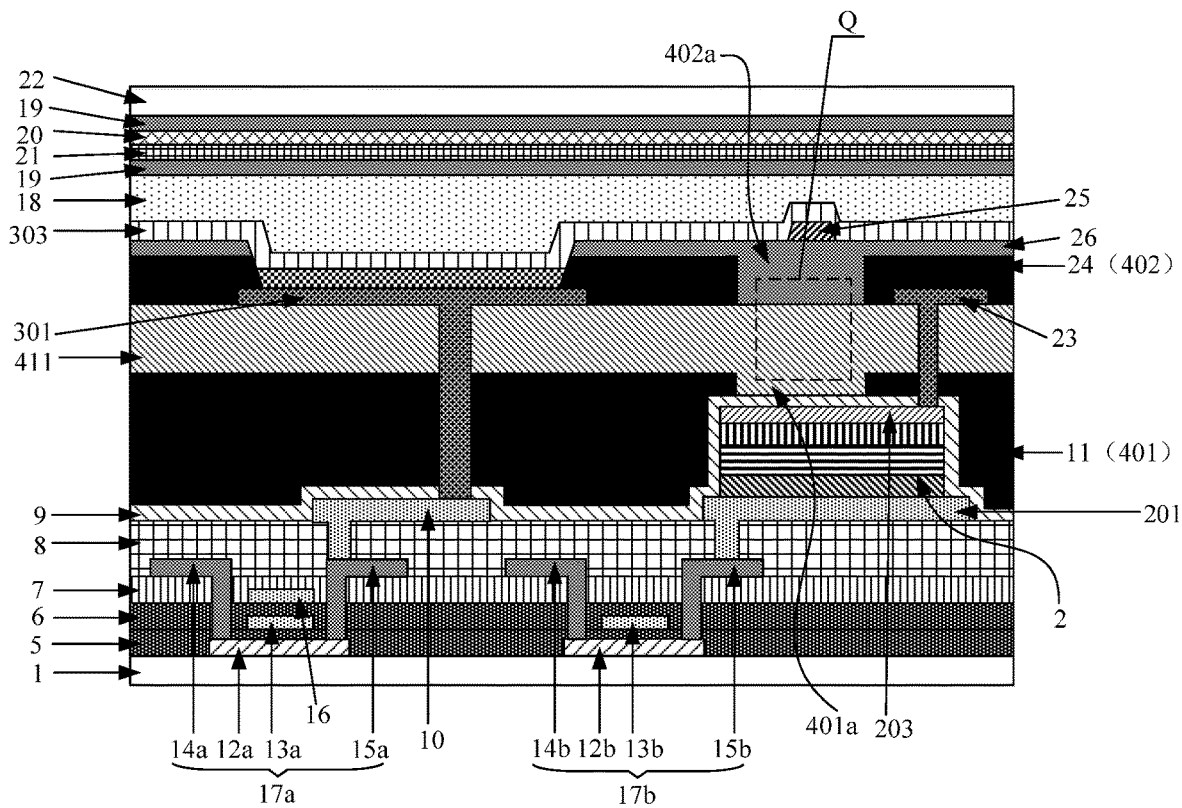
FIG. 5 is a schematic cross-sectional diagram of another display panel provided in an embodiment of the present disclosure.
Figure 6:
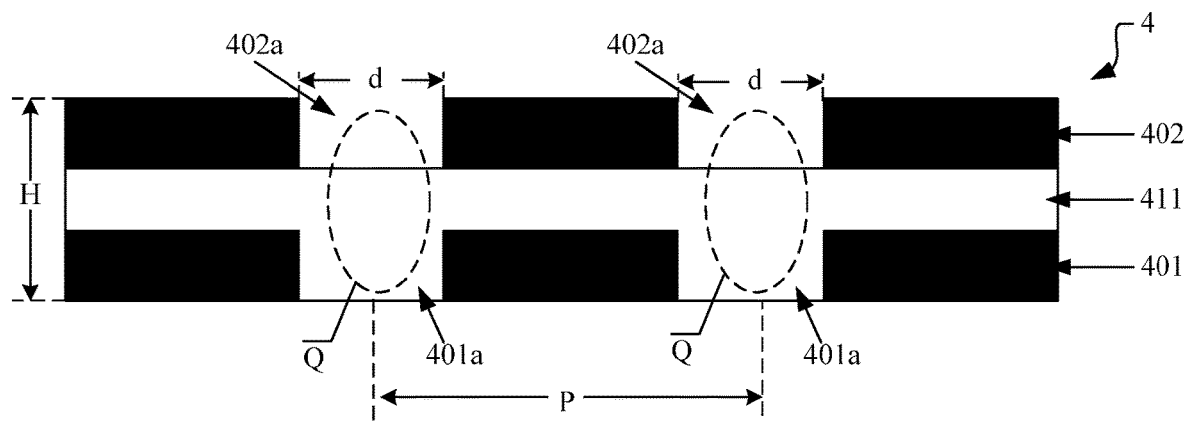
FIG. 6 is a schematic cross-sectional diagram of a light path structure in the display panel shown in FIG. 5.

FIG. 5 is a schematic cross-sectional diagram of another display panel provided in an embodiment of the present disclosure; FIG. 6 is a schematic cross-sectional diagram of a light path structure in the display panel shown in FIG. 5. As shown in FIG. 5 and FIG. 6, unlike the light path structure 4 in the display panel shown in FIG. 1, the light path structure 4 in the display panel shown in FIG. 5 includes two light shielding layers 401 and 402, specifically, a first light shielding layer 401 and a second light shielding layer 402 located on a side of the first light shielding layer 401 distal to the substrate 1, and a light transmission layer 411 is disposed between the first light shielding layer 401 and the second light shielding layer 402; the first light shielding layer 401 is provided with first light transmission holes 401a arranged in an array, the second light shielding layer 402 is provided with second light transmission holes 402a in one-to-one correspondence with the first light transmission holes 401a, and the first light transmission hole 401a and the corresponding second light transmission hole 402a define a light transmission channel Q.

Referring to FIG. 6, orthographic projections of the first light transmission hole 401a and the corresponding second light transmission hole 402a on the substrate 1 completely overlap. An aperture of the first light transmission hole 401a and an aperture of the second light transmission hole 402a are both d, and the thickness of the light path structure 4 is H, a light outgoing angle of the light transmission channel Q ranges from 0° to arctan(d/H). If a predetermined critical angle at which crosstalk occurs is $\alpha$, to substantially eliminate the crosstalk of the reflected light, it is required to satisfy arctan(d/H)≤$\alpha$, that is, d/H≤tan $\alpha$.

In addition, the reflected light that is reflected from the fingerprint also generally has one maximum angle $\theta$max, where a collimation structure adopts two light shielding layers, in order to prevent the light crosstalk, the thickness H of the light path structure 4 and an arrangement period P (a distance between central points of two adjacent light transmission holes) of light transmission holes on the light shielding layer necessarily satisfy: arctan(P/H)≤$\theta$max, i.e., P/H≤$\theta$max.

Figure 7:
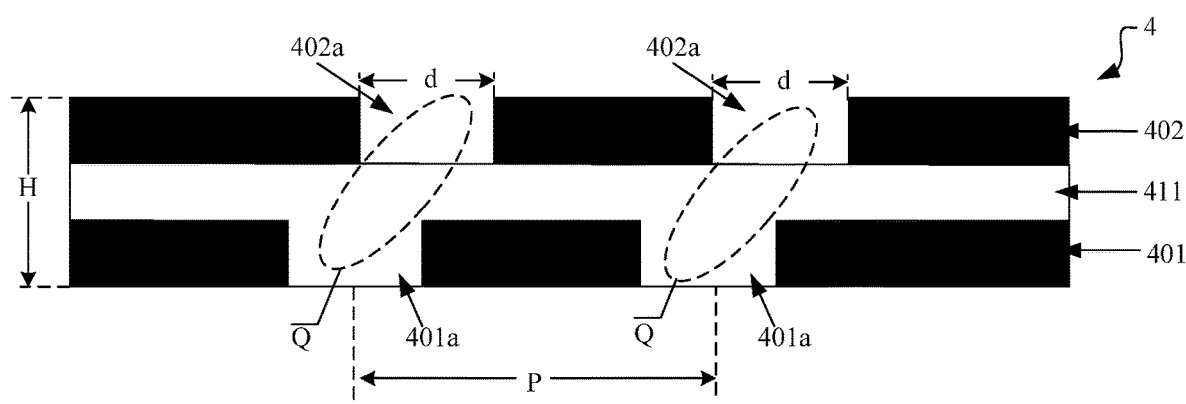
FIG. 7 is a schematic cross-sectional diagram of a light path structure in an embodiment of the present disclosure.

FIG. 7 is a schematic cross-sectional diagram of a light path structure in an embodiment of the present disclosure. As shown in FIG. 7, unlike the case shown in FIG. 6 where the orthographic projections of the first light transmission hole 401a and the corresponding second light transmission hole 402a on the substrate 1 completely overlap, in the case shown in FIG. 7, the first light transmission hole 401a and the corresponding second light transmission hole 402a are arranged in a staggered manner, which may also have a collimating function to some extent. The apertures d of the first light transmission hole 401a and the second light transmission hole 402a, the thickness H of the light path structure 4, and a period P of the light transmission holes in the light shielding layer in the case shown in FIG. 7 may be set according to practical needs.

Figure 8:
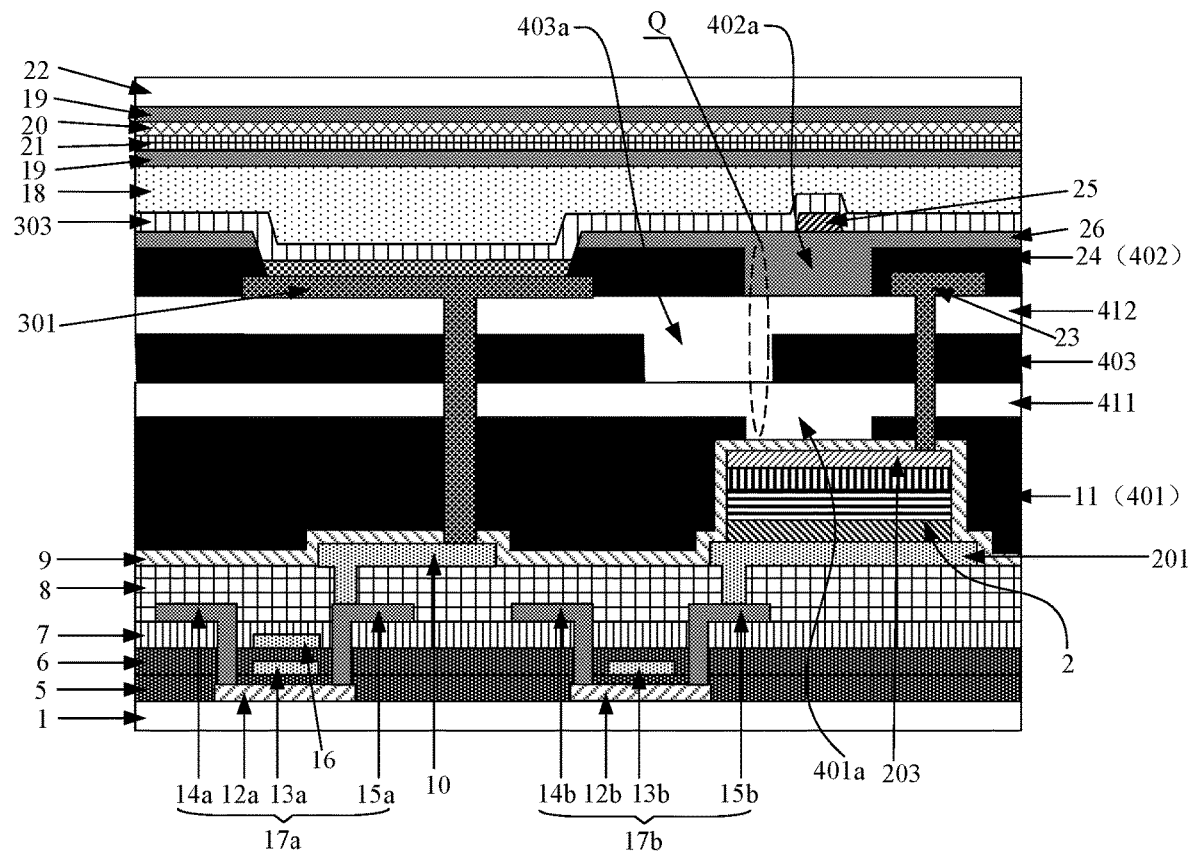
FIG. 8 is a schematic cross-sectional diagram of another display panel provided in an embodiment of the present disclosure.
Figure 9:
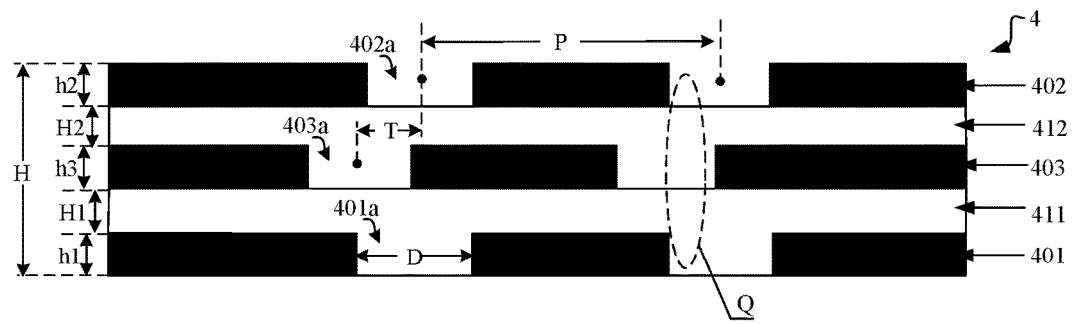
FIG. 9 is a schematic cross-sectional diagram of a light path structure in the display panel shown in FIG. 8.
Figure 10:
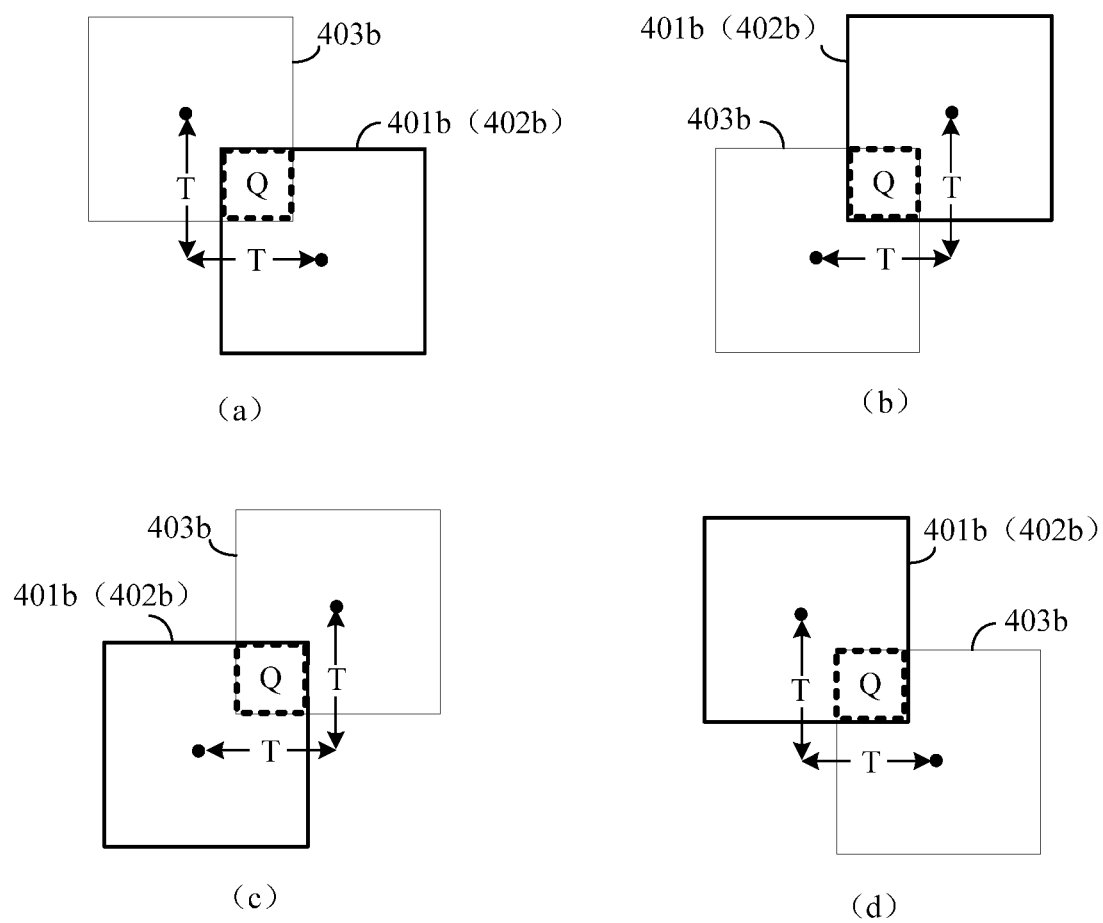
FIG. 10 are various schematic diagrams illustrating orthographic projections of a first light transmission hole, a second light transmission hole and a third light transmission hole corresponding to the first light transmission hole on a substrate in a collimation structure shown in FIG. 9.

FIG. 8 is a schematic cross-sectional diagram of another display panel provided in an embodiment of the present disclosure; FIG. 9 is a schematic cross-sectional diagram of a light path structure in the display panel shown in FIG. 8; FIG. 10 are various schematic diagrams illustrating orthographic projections of a first light transmission hole, a second light transmission hole and a third light transmission hole corresponding to the first light transmission hole on a substrate in a collimation structure shown in FIG. 9. As shown in FIG. 8 to FIG. 10, unlike the light path structure 4 shown in the previous embodiment, the light path structure 4 shown in FIG. 8 and FIG. 9 includes at least three light shielding layers 401, 402, and 403, a light transmission layer is disposed between every two adjacent light shielding layers, the light shielding layer closest to a photoelectric sensing structure is a first light shielding layer 401, the light shielding layer farthest from the photoelectric sensing structure is a second light shielding layer 402, and a light shielding layer between the first light shielding layer 401 and the second light shielding layer 402 is a third light shielding layer 402; the first light shielding layer 401 is provided with first light transmission holes 401a arranged in an array, the second light shielding layer 402 is provided with second light transmission holes 402a in one-to-one correspondence with the first light transmission holes 401a, the third light shielding layer 402 is provided with third light transmission holes 403a in one-to-one correspondence with the first light transmission holes 401a, and the first light transmission hole 401a and the corresponding second light transmission hole 402a and the corresponding third light transmission hole 403a define a light transmission channel Q.

In some embodiments, the number of the third light shielding layers 402 is 1. In this case, the light path structure 4 has a stacked structure including three light shielding layers 401, 402, and 403.

In some embodiments, an orthographic projection of the second light transmission hole 402a on the substrate 1 and an orthographic projection of the first light transmission hole 401a on the substrate 1 have substantially the same shape, and a ratio of an area of the orthographic projection of the first light transmission hole on the substrate to an area of the orthographic projection of the second light transmission hole on the substrate ranges from 0.2 to 1.

Referring to FIGS. 8 to 10, in some embodiments, the first light transmission hole 401a has a rectangular cross-sectional shape in a cross-section parallel to the plane in which the substrate 1 is located. Further, the first light transmission hole 401a has a square cross-sectional shape in a cross-section parallel to the plane in which the substrate 1 is located.

Referring to FIGS. 8 to 10, in some embodiments, an orthographic projection of the third light transmission hole 403a on the substrate 1 and the orthographic projection of the first light transmission hole 401a on the substrate 1 have substantially the same shape, and have substantially the same area. In a case where the orthographic projection of the second light transmission hole 402a on the substrate 1 and the orthographic projection of the first light transmission hole 401a on the substrate 1 have substantially the same shape, and have substantially the same area, the first light transmission hole 401a, the second light transmission hole 402a and the third light transmission hole 403a have the same shape and the same size, and therefore, may be formed by adopting the same process.

Referring to FIGS. 8 to 10, in some embodiments, orthographic projections of the first light transmission hole 401a, the second light transmission hole 402a corresponding to the first light transmission hole 401a, and the third light transmission hole 403a corresponding to the first light transmission hole 401a on the substrate 1 overlap each other, and the overlapping region is a region where the light transmission channel Q is located.

As an alternative embodiment, orthographic projections of the first light transmission hole 401a and the second light transmission hole 402a corresponding to the first light transmission hole 401a on the substrate 1 completely overlap; orthographic projections of the first light transmission hole 401a and the third light transmission hole 403a corresponding to the first light transmission hole 401a on the substrate partially overlap.

In some embodiments, a region where orthographic projections of the first light transmission hole 401a and the corresponding third light transmission hole 403a, on the plane where the substrate 1 is located, overlap each other has a square shape. In FIGS. 9 and 10, the overlapping region is the region where the light transmission channel Q is located, and has a square shape.

Referring to FIGS. 8 to 10, in some embodiments, orthographic projections of the first, second and third light transmission holes 401a, 402a and 403a on the substrate are respectively a first orthographic projection 401b, a second orthographic projection 402b and a third orthographic projection 403b, which have substantially the same area and have a square shape, and one of any two sides intersecting with each other of the square extends along a first direction, and the other one extends along a second direction; the first orthographic projection 401b completely overlaps the second orthographic projection 402b, and the first orthographic projection 401b partially overlaps the third orthographic projection 403b; distances in the first direction and in the second direction between a center of the first orthographic projection 401b and a center of the third orthographic projection 403b are equal to each other.

Part (a) in FIG. 10 illustrates that the center of the third orthographic projection 403b is located at the upper left corner of the centers of the first orthographic projection 401b/the second orthographic projection 402b, part (b) in FIG. 10 illustrates that the center of the third orthographic projection 403b is located at the lower left corner of the centers of the first orthographic projection 401b/the second orthographic projection 402b, part (c) in FIG. 10 illustrates that the center of the third orthographic projection 403b is located at the upper right corner of the centers of the first orthographic projection 401b/the second orthographic projection 402b, and part (d) in FIG. 10 illustrates that the center of the third orthographic projection 403b is located at the lower right corner of the centers of the first orthographic projection 401b/the second orthographic projection 402b.

Further, side lengths of the first orthographic projection 401b, the second orthographic projection 402b and the third orthographic projection 403b are all D, the distances in the first direction and in the second direction between the center of the first orthographic projection 401b and the center of the third orthographic projection 403b are all T, the thickness of the light path structure 4 is H, and a collimation light-receiving angle θ of the light transmission channel Q in the light path structure 4 is:

$$\theta=\arctan((D-T)/H) \quad \text{formula (1)}$$

In some embodiments, the collimation light-receiving angle θ ranges from 10° to 20°. The light-receiving angle θ may be determined by designing values of the side length D, the distance T and the thickness H.

In some embodiments, the side length D is in the range of 4 μm to 10 μm; the distance T is in the range of 1 μm to 3 μm.

To prevent the crosstalk of light from occurring in the light path structure 4 while realizing the collimation effect, it still needs to reasonably design the arrangement period of light transmission holes, the thickness of each light shielding layer, the thickness of each light transmission layer, and an overall thickness of the collimation structure.

In some embodiments, the arrangement periods of the first light transmission holes 401a, the second light transmission holes 402a, and the third light transmission holes 403a are equal to each other and are P, a thickness of the first light shielding layer 401 is h1, a thickness of the second light shielding layer 402 is h2, a thickness of the third light shielding layer 402 is h3, a thickness of the light transmission layer 411 between the first light shielding layer 401 and the third light shielding layer 402 is H1, and a thickness of the light transmission layer 412 between the second light shielding layer and the third light shielding layer 402 is H2. D, T, H, P, h1, h2, h3, H1 and H2 satisfy:

$$H/(P+D) \leq (h1+h3+H1)/(D+T) \leq (h2+H2)/(P-T) \quad \text{formula (2)}$$

Where H=h1+h2+h3+H1+H2.

More specifically, in some embodiments, the arrangement period P is in the range of: 5 μm to 20 μm; the thickness h1 of the first light shielding layer 401 is in the range of: 1 μm to 3 μm; the thickness h2 of the second light shielding layer 402 is in the range of: 1 μm to 3 μm; the thickness h3 of the third light shielding layer 402 is in the range of: 1 μm to 3 μm; the thickness H1 of the light transmission layer 411 located between the first light shielding layer 401 and the third light shielding layer 402 is in the range of: 0.5 μm to 4 μm; the thickness H2 of the light transmission layer 412 located between the second light shielding layer 402 and the third light shielding layer 402 is in the range of: 0.5 μm to 4 μm.

As one example satisfying the formula (2), the side length D is 4 μm, the thicknesses H1, H2, h1, h2 and h3 are all the distance T is 2.5 μm, and the arrangement period P of the light transmission holes is 10 μm; the light-receiving angle θ=46° is calculated according to the formula (1).

It should be noted that the case where the light path structure 4 shown in FIGS. 8 and 9 includes three light shielding layers is only exemplary, and does not limit the technical solution of the present disclosure. The number of light shielding layers may be greater than three in the embodiment of the present disclosure, and the positional relationship among light transmission holes in respective light shielding layers also may be adjusted according to practical need, as long as light transmission holes in the plurality of light shielding layers may define the light transmission channels Q that have the collimation effect, which is not enumerated here.

Referring to FIGS. 5 and 8, in some embodiments, a second planarization layer 11 is provided on a side of the photoelectric sensing structure distal to the substrate 1 and a material of the second planarization layer 11 includes: a light shielding material; the second planarization layer 11 is multiplexed as the first light shielding layer 401.

Further, a first passivation layer 9 is disposed between the second planarization layer 11 and the photoelectric sensing structure.

In some embodiments, a pixel definition layer 24 is provided on a side of the second planarization layer 11 distal to the substrate 1, the pixel definition layer 24 has a pixel opening therein, the light emitting layer 302 is located in the pixel opening, the second electrode 303 is located on a side of the pixel definition layer 24 distal to the substrate 1, and the material of the pixel definition layer 24 includes: a light shielding material; the pixel definition layer 24 is multiplexed as the second light shielding layer 402.

Further, a filter layer 26 is disposed between the second electrode 303 and the pixel definition layer 24, and fills the second light transmission hole 402a in the pixel definition layer 24, and the filter layer 26 is configured to filter out non-visible light in the transmitted light.

In some embodiments, a spacer dam 25 surrounding the pixel opening is disposed between the filter layer 26 and the second electrode 303. The spacer dam 25 is disposed between adjacent pixel openings to prevent color mixing in the subsequent deposition of the light emitting layer 302 in the pixel openings by an evaporation process.

Figure 11:
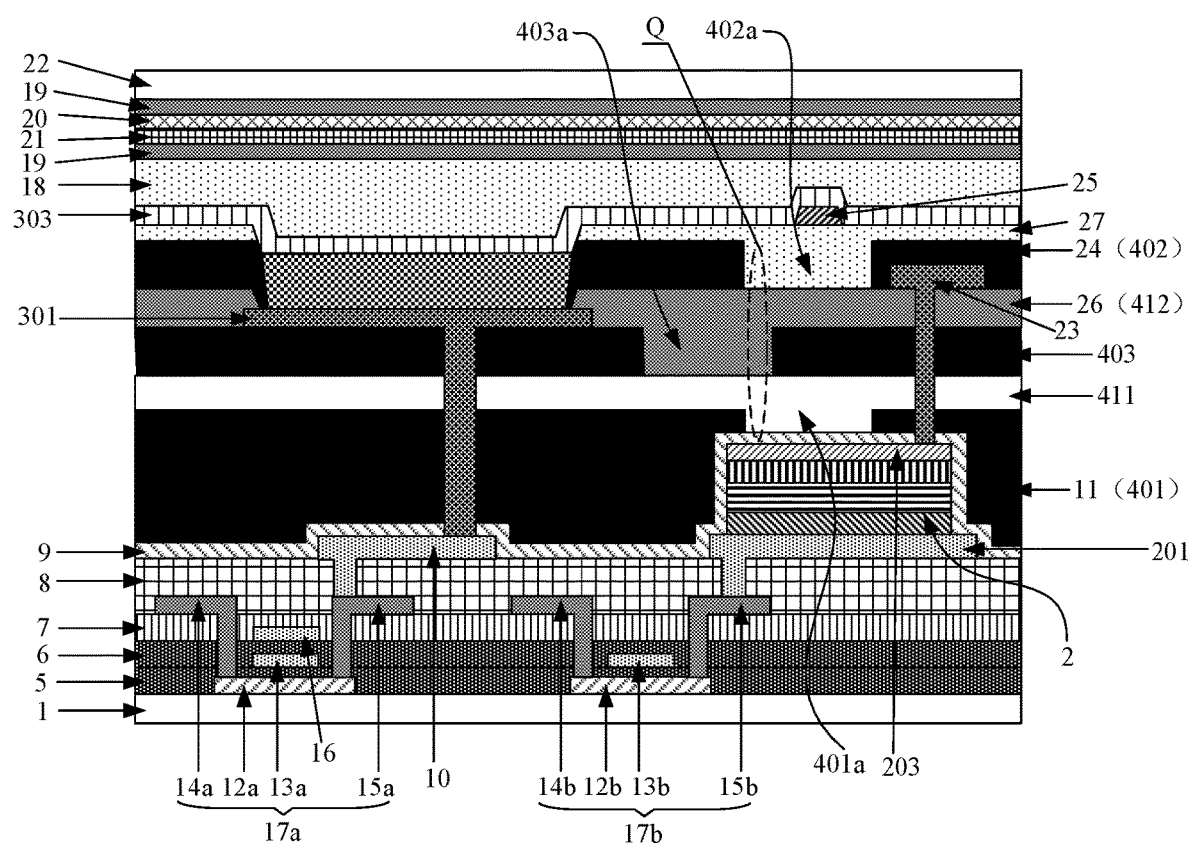
FIG. 11 is a schematic cross-sectional diagram of another display panel provided in an embodiment of the present disclosure.

FIG. 11 is a schematic cross-sectional diagram of another display panel provided in an embodiment of the present disclosure. As shown in FIG. 11, unlike the cases shown in FIG. 5 and FIG. 8, in the display panel shown in FIG. 11, the filter layer 26 is located between the first light shielding layer 401 and the second light shielding layer 402, and is multiplexed into at least one light transmission layer.

Where the light path structure 4 includes only two light shielding layers (i.e., the first light shielding layer 401 and the second light shielding layer 402), the filter layer 26 may be multiplexed as a light transmission layer between the first light shielding layer 401 and the second light shielding layer 402, which is not shown in drawings.

Referring to FIG. 11, where the light path structure 4 includes three light shielding layers, as one example, the filter layer 26 may be multiplexed as a light transmission layer 412 between the second light shielding layer 402 and the third light shielding layer 402. Alternatively, the filter layer 26 may be multiplexed as a light transmission layer 411 between the first light shielding layer 401 and the third light shielding layer 402, which is not shown in drawings.

In addition, where the light path structure 4 includes a plurality of light shielding layers, the filter layer 26 is multiplexed as a light transmission layer between any two adjacent light shielding layers.

In this embodiment, since the filter layer 26 is located between the first and second light shielding layers 401 and 402, other film layers are required to fill the second light transmission holes 402a of the second light shielding layer 402 for forming other film layers later. Referring to FIG. 11, in some embodiments, a filling layer 27 is disposed between the second electrode 303 and the pixel definition layer 24, fills the second light transmission holes 402a in the pixel definition layer 24, and the spacer dam 25 surrounding the pixel aperture is disposed between the filling layer 27 and the second electrode 303.

In some embodiments, the material of the filling layer 27 is a transparent resin material.

Figure 12:
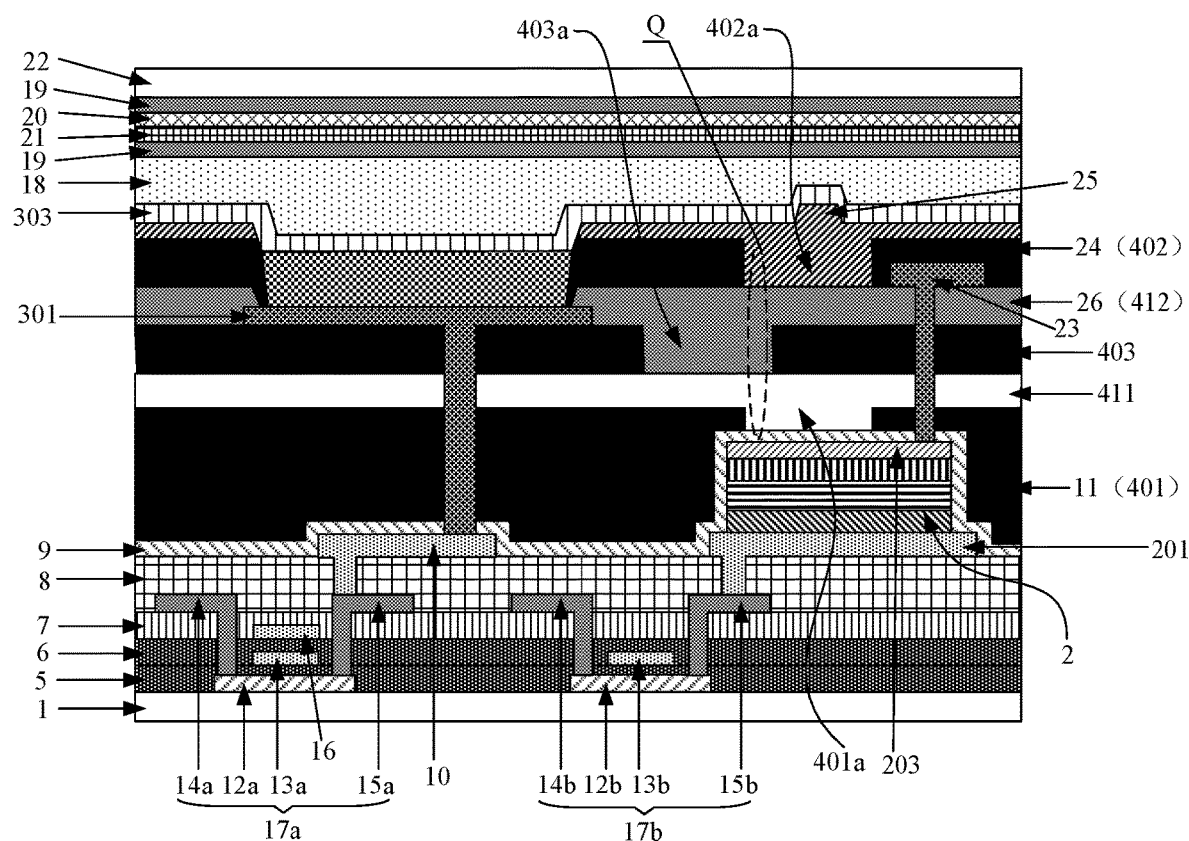
FIG. 12 is a schematic cross-sectional diagram of another display panel provided in an embodiment of the present disclosure.

FIG. 12 is a schematic cross-sectional diagram of another display panel provided in an embodiment of the present disclosure. As shown in FIG. 12, unlike the case in FIG. 11 where the filling layer 27 is used for filling the second light transmission holes 402a in the pixel definition layer 24, in the display panel shown in FIG. 12, the filling layer 27 is not disposed, but the material of the spacer dam 25 is directly used for filling the second light transmission holes 402a in the pixel definition layer 24.

Referring to FIGS. 5, 8, 11, and 12, in some embodiments, the filter layer 26 includes: an infrared filter layer configured to filter out infrared light. Under strong ambient light, most of the light transmitted through the finger is infrared light (with a wavelength range of 760 nm to 1 mm), and the reflected light emitted by the light emitting element 3 and then reflected by the print surface is visible light (with a wavelength range of 400 nm to 700 nm). In the embodiment of the present disclosure, the infrared filter layer is configured to block infrared light and enable visible light to pass through, so that the reflected light reflected by the print surface may pass through the infrared filter layer but infrared light passing through a finger cannot pass through the infrared filter layer, thereby weakening or even completely eliminating the influence of ambient light on the photoelectric sensor 2, and improving the anti-glare performance of products.

Referring to FIGS. 8, 11 and 12, in some embodiments, the material of the third light shielding layer 402 between the first light shielding layer 401 and the second light shielding layer 402 includes a black resin material; the third light shielding layer 402 may be formed by a patterning process or an imprinting process. It should be noted that FIG. 8, FIG. 11, and FIG. 12 only exemplarily show one third light shielding layer 402, and the number of the third light shielding layers 402 may also be two or more in the embodiment of the present disclosure.

In the practical production process, it is found that as the number of organic layers (for example, light shielding layers and light transmission layers) continuously formed increases, a morphology of the organic layers becomes more difficult to be controlled, which easily results in that the formed organic layers are abnormal (for example, a surface of the organic layer is not flat). In the embodiment of the present disclosure, where the light path structure 4 adopts a structure having three light shielding layers and two light transmission layers, if the light shielding layers and the light transmission layers are both formed by organic layers, a structure in which 5 organic layers are continuously stacked is formed. In this case, the requirement on the production process is high, and the production difficulty is high.

Figure 13:
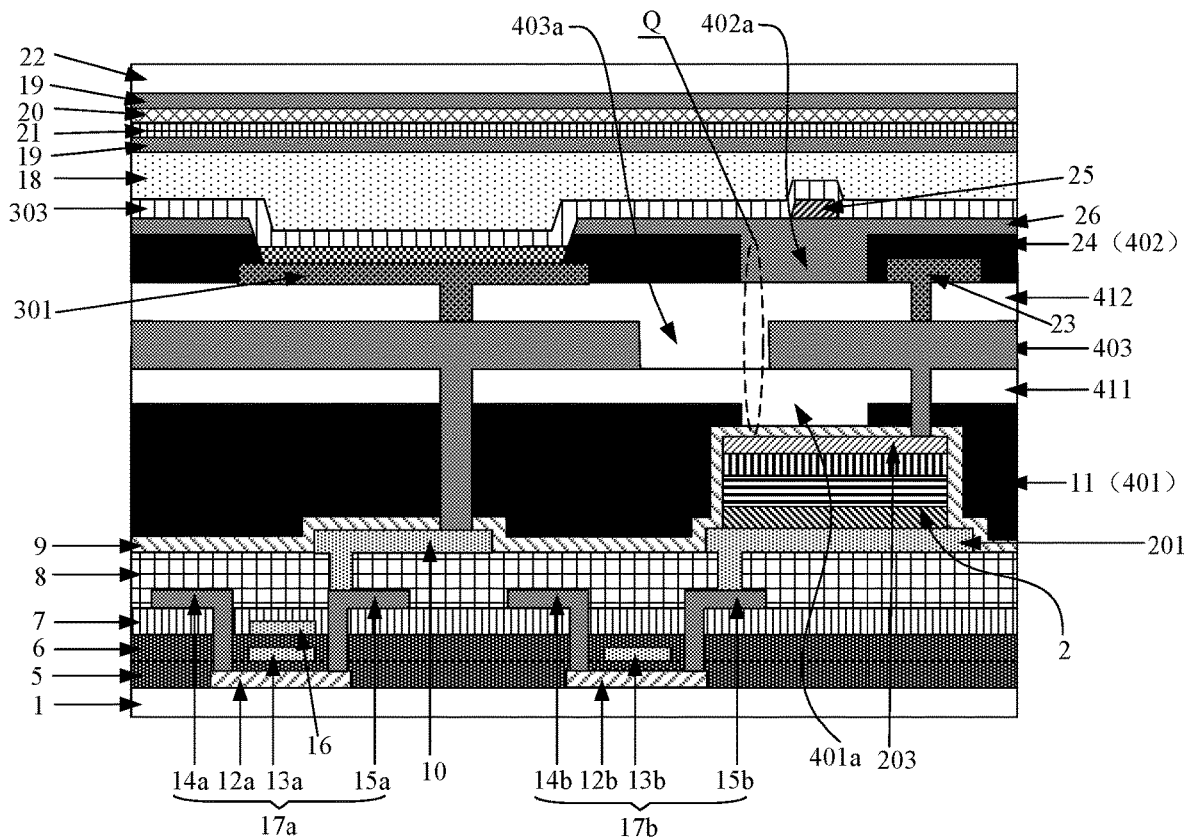
FIG. 13 is a schematic cross-sectional diagram of another display panel provided in an embodiment of the present disclosure.

In order to solve the technical problem, the embodiment of the present disclosure further provides a corresponding solution. FIG. 13 is a schematic cross-sectional diagram of another display panel provided in an embodiment of the present disclosure. As shown in FIG. 13, unlike the cases shown in FIG. 8, FIG. 11, and FIG. 12, a material of the third light shielding layer 402 in the display panel shown in FIG. 13 includes: a metal material. In this case, the third light shielding layer 402 in the middle is made of a metal material, such that the number of organic layers that may be continuously stacked may be effectively reduced, thereby reducing the requirements on the production process.

In the embodiment of the present disclosure, a second passivation layer (made of an inorganic insulating material, for example, silicon oxide, silicon nitride, or the like) is disposed between the third light shielding layer 402 made of a metal material and the light transmission layer located on a side of the third light shielding layer 402 proximal to the substrate 1 and closest to the third light shielding layer, so as to avoid the following problems: the third light shielding layer 402 made of a metal material is in direct contact with the light transmission layer made of an organic material, so that the adhesion force between the third light shielding layer 402 and the light transmission layer is low, and peeling is easily generated.

It should be noted that where the third light shielding layer 402 is made of a metal material, the third light shielding layer 402 may include a plurality of metal patterns insulated from each other, one metal pattern corresponds to one light emitting device 3, and the first electrode 301 in the light emitting device 3 is electrically connected to a first drain 15a of a corresponding first transistor 17a through the corresponding metal pattern. The first electrode 301 may be connected in parallel with the corresponding metal pattern to reduce the equivalent resistance at the first electrode 301.

With continued reference to FIGS. 1, 5, 8, 11, 12, 13, in some embodiments, the display panel further includes: a driving circuit layer between the substrate 1 and the photoelectric sensing structure, the driving circuit layer having a plurality of first transistors 17a corresponding to the light emitting elements 3 and a plurality of second transistors 17b corresponding to the photoelectric sensors 2; a drain of the first transistor 17a is electrically connected to the first electrode 301 in the corresponding light emitting element 3, and a drain of the second transistor 17b is electrically connected to the third electrode 201 in the corresponding photoelectric sensor 2.

In some embodiments, the driving circuit layer includes an active layer, a first gate insulating layer 5, a first gate conductive layer, a second gate insulating layer 6, a second gate conductive layer, an interlayer dielectric layer 7, a first source drain conductive layer, and a first planarization layer 8, which are sequentially stacked along a direction distal to the substrate 1. A second source drain conductive layer is further provided on a side of the first planarization layer 8 distal to the substrate 1, and includes: the third electrode 301.

The first active layer includes a first active pattern 12*a* and a second active pattern 12*b* disposed in the same layer; the first gate conductive layer includes at least a first gate 13*a* and a second gate 13*b* (which may also include a gate line and other structures) disposed in the same layer; the second gate conductive layer includes at least a capacitor electrode 16 (which may include other conductive structures such as signal traces and electrodes). A storage capacitor may be formed between the capacitor electrode and the first gate 13*a*; the source drain conductive layer at least includes a first source 14*a*, a first drain 15*a*, a second source 14*b* and a second drain 15*b* (which may also include structures such as data lines) disposed in the same layer. The first source 14*a* and the first drain 15*a* are electrically connected with the first active pattern 12*a* through vias; the second source 14*b* and the second drain 15*b* are electrically connected with the second active pattern 12*b* through vias. The first gate 13*a*, the first source 14*a*, the first drain 15*a* and the first active pattern 12*a* form the first transistor 17*a*; and the second gate 13*b*, the second source 14*b*, the second drain 15*b* and the second active pattern 12*b* form the second transistor 17*b*; the second source drain conductive layer includes a first connection electrode 10 and a second connection electrode, the first connection electrode 10 is electrically connected with the first drain 15*a* through a via; and the second connection electrode is electrically connected with the second drain 15*b* through a via. The second connection electrode is multiplexed as the third electrode 201 in the photoelectric sensor 2, which is electrically connected to the second drain 15*b* of the corresponding second transistor 17*b* in this case; the first electrode 301 in the light emitting element 3 is electrically connected to the first connection electrode 10 through a via, and is electrically connected to the first drain 15*a* of the corresponding first transistor 17*a*.

In some embodiments, a bias voltage line 23 is provided on a side of the photoelectric sensing structure distal to the substrate 1, is electrically connected to a fourth electrode 203, and is disposed in the same layer as the first electrode 301. The bias voltage line 23 and the first electrode 301 may be made of a metal material such as copper, aluminum, titanium, molybdenum, or the like, or an alloy material.

In some embodiments, an encapsulation layer and a cover plate 22 are provided on a side of the second electrode 303 distal to the substrate 1, and the cover plate 22 is located on a side of the encapsulation layer 18 distal to the substrate 1. Generally, the encapsulation layer 18 includes inorganic encapsulation layers and organic encapsulation layers alternately arranged. For example, the encapsulation layer 18 is of a three-layer encapsulation structure with two inorganic encapsulation layers and one organic encapsulation layer sandwiched therebetween. The cover plate 22 is a transparent cover plate 22, and may be made of polyimide (PI) or glass.

In some embodiments, a touch functional layer 20 is disposed between the encapsulation layer 18 and the cover plate 22. The touch functional layer 20 is a film structure having a touch function, and may be directly formed on the cover plate 22 through a film deposition process (including processes such as film deposition and film patterning) and then be fixed to the encapsulation layer 18 through an optical adhesive 19 (OCA adhesive), or be directly formed on the encapsulation layer 18 through a film deposition process. Alternatively, the touch functional layer 20 is firstly formed on another substrate, and then, fixed to the cover plate 22 and the encapsulation layer 18 through the optical adhesive 19.

In some embodiments, a circular polarizer 21 is disposed between the encapsulation layer 18 and the cover plate 22, and is used for blocking light reflected by a metal electrode surface inside the display panel to improve display contrast. The circular polarizer 21 may be fixed to other structures by the optical adhesive 19.

It should be noted that where the touch functional layer 20 and the circular polarizer 21 are both present between the encapsulation layer 18 and the cover plate 22, generally, the circular polarizer 21 is located on a side of the touch functional layer 20 distal to the cover plate 22.

The display panel in the embodiment of the present disclosure may be formed by the following processes: firstly, the active layer, the first gate insulating layer 5, the first gate conductive layer, the second gate insulating layer 6, the second gate conductive layer 16, the interlayer dielectric layer 7, the first source drain conductive layer, the first planarization layer 8, the second source drain conductive layer (including the third electrode 201), the photoelectric conversion layer 202, the fourth electrode 203, the first passivation layer 9, the light path structure 4, the first electrode 301, the pixel definition layer 24, the spacer dam 25, the light emitting layer 302, the second electrode 303 and the encapsulation layer 18 are sequentially formed; then, the touch functional layer 20 and the circular polarizer 21 are sequentially formed on the cover plate 22 through a deposition or lamination process; finally, the functional film layers on the cover plate 22 is attached to the encapsulation layer 18 through a lamination process. In the practical production process, some steps may be adjusted according to the practical situation with requirements on the product.

Where the second light shielding layer 402 is present in the light path structure 4 and the pixel definition layer 24 is multiplexed as the second light shielding layer 402, a step of forming the filter layer 26 between steps of forming the pixel definition layer 24 and forming the spacer dam 25 is further included, alternatively, a step of forming the filter layer 26 is further included before forming the second light shielding layer 402 in the process of forming the light path structure.

It should be noted that different technical means in the above embodiments may be combined with each other, to obtain a new technical solution which also falls within the protection scope of the present disclosure.

In addition, in the above embodiment, as a preferred embodiment in the present disclosure, the light path structure 4 includes multiple light shielding layers, and the light transmission channels Q are defined by the light transmission holes in the multiple light shielding layers. Taking a case that the light path structure 4 includes three light shielding layers as an example, by adjusting the position relationship among the first light transmission hole 401*a* and the corresponding second light transmission hole 402*a* and the corresponding third light transmission hole 403*a*, a light transmission channel Q having a cross section (parallel to the plane where the substrate 1 is located) area smaller than that of the cross section of each light transmission hole may be defined. That is, an aperture corresponding to the light transmission channel Q is smaller than an aperture of the light transmission hole, and theoretically, the aperture corresponding to the light transmission channel Q may be infinitely small and is not limited by the size of the aperture of the light transmission hole. In a case where the required collimation light-receiving angle θ of the light transmission channel Q is fixed, the smaller the aperture corresponding to the light transmission channel Q is, the smaller the thickness of the light transmission channel Q is (that is, the smaller the thickness of the light path structure 4 is), which is more beneficial to the lightening and thinning of the display panel.

Of course, the specific structure of the light path structure 4 shown in the above embodiments only serves as an exemplary function, which does not limit the technical solution of the present disclosure, and the light path structure 4 in the present disclosure may also adopt other structures, which are not described here by way of example.

Figure 14:
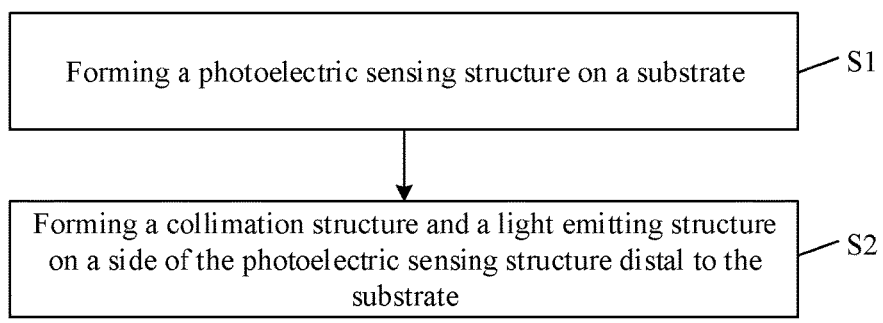
FIG. 14 is a flowchart of a method for manufacturing a display panel provided in an embodiment of the present disclosure.

Based on the same inventive concept, an embodiment of the present disclosure also provides a method for manufacturing the display panel. FIG. 14 is a flowchart of a manufacturing method for a display panel provided in an embodiment of the present disclosure, and as shown in FIG. 14, the manufacturing method may be used to manufacture the display panel provided in any one of the foregoing embodiments, and the manufacturing method includes:

Step S1, forming a photoelectric sensing structure on a substrate.

Step S2, forming a light path structure and a light emitting structure on a side of the photoelectric sensing structure distal to the substrate.

The light emitting structure includes: a plurality of light emitting elements, each of which includes: a first electrode, a light emitting layer, and a second electrode which are successively arranged in a direction distal to the substrate; the light path structure is located between the photoelectric sensing structure and the second electrode.

For the detailed description of the step S1 and the step S2, reference may be made to the corresponding contents in the foregoing embodiments, and details are not repeated herein.

Based on the same inventive concept, an embodiment of the present disclosure further provides a display device, including the display panel provided in any one of the foregoing embodiments and an outer frame for fixing the display panel, and for specific description of the display panel, reference may be made to corresponding contents in the foregoing embodiments, and details are not repeated herein.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A display panel, comprising:
a substrate;
a photoelectric sensing structure on a side of the substrate;
a light emitting structure on a side of the photoelectric sensing structure distal to the substrate, and comprising a plurality of light emitting elements, each of which comprises: a first electrode, a light emitting layer, and a second electrode which are successively arranged in a direction distal to the substrate; and
a light path structure between the photoelectric sensing structure and the second electrode, and configured to collimate light which is on a side of the photoelectric sensing structure distal to the substrate and has a propagation direction towards the photoelectric sensing structure; wherein the photoelectric sensing structure and the light emitting structure do not overlap each other or do partially overlap each other in a direction perpendicular to the substrate; and
the light path structure at least partially overlaps the photoelectric sensing structure in the direction perpendicular to the substrate;
wherein the light path structure has a plurality of light transmission channels, the light path structure comprises at least one light shielding layer with a plurality of light transmission holes, which define the plurality of light transmission channels;
wherein the at least one light shielding layer comprises: a first light shielding layer and a second light shielding layer on a side of the first light shielding layer distal to the substrate, and a light transmission layer is provided between the first light shielding layer and the second light shielding layer; the first light shielding layer has first light transmission holes in an array, the second light shielding layer has second light transmission holes in one-to-one correspondence with the first light transmission holes, and the first light transmission hole and a corresponding one of the second light transmission holes define the light transmission channel;
wherein the display panel further comprises a second planarization layer which is on a side of the photoelectric sensing structure distal to the substrate and having a material of a light shielding material; wherein the second planarization layer is multiplexed as the first light shielding layer;
wherein the photoelectric sensing structure comprises a plurality of photoelectric sensors, each of which comprises a third electrode, a photoelectric conversion layer, and a fourth electrode which are arranged successively in a direction distal to the substrate; the display panel further comprises: a driving circuit layer between the substrate and the photoelectric sensing structure, and comprising first transistors electrically connected to the light emitting elements and second transistors electrically connected to the photoelectric sensors; and a drain of the first transistor is electrically connected to the first electrode of a corresponding light emitting element of the light emitting elements, and a drain of the second transistor is electrically connected to the third electrode of a corresponding photoelectric sensor of the photoelectric sensors;
wherein the display panel further comprises a bias voltage line which is on a side of the photoelectric sensing structure distal to the substrate, is electrically connected to the fourth electrode, and is in the same layer as the first electrode; and
a corresponding first light transmission hole of the first light shielding layer at least partially overlaps with an orthographic projection of the fourth electrode on the substrate; the bias voltage line is electrically connected to the fourth electrode by a via arranged in the second planarization layer, and an orthographic projection of the via on the substrate does not overlap with the orthographic projection of the corresponding first light transmission hole on the substrate and does overlap with the orthographic projection of the orthographic projection of the fourth electrode on the substrate.

2. The display panel of claim 1, wherein
an angle, between a propagation direction of light emitted from the light transmission channel to the photoelectric sensing structure and a normal of a plane where the substrate is located, ranges from 0° to 72°.

3. The display panel of claim 2, wherein the angle, between the propagation direction of light emitted from the light transmission channel to the photoelectric sensing structure and the normal of the plane where the substrate is located, ranges from 0° to 20°.

4. The display panel of claim 2, wherein the photoelectric sensing structure comprises a plurality of photoelectric sensors, each of which corresponds to at least one of the plurality of light transmission channels.

5. The display panel of claim 1, wherein the at least one light shielding layer further comprises at least one third light shielding layer between the first light shielding layer and the second light shielding layer, and a light transmission layer is provided between every two adjacent light shielding layers; and
the third light shielding layer has third light transmission holes in one-to-one correspondence with the first light transmission holes, and the first light transmission hole together with a corresponding one of the second light transmission holes and a corresponding one of the third light transmission holes define the light transmission channel.

6. The display panel of claim 5, wherein an orthographic projection of the second light transmission hole on the substrate and an orthographic projection of the first light transmission hole on the substrate have substantially a same shape, and
a ratio of an area of the orthographic projection of the first light transmission hole on the substrate to an area of the orthographic projection of the second light transmission hole on the substrate ranges from 0.2 to 1.

7. The display panel of claim 6, wherein an orthographic projection of the third light transmission hole on the substrate and an orthographic projection of the first light transmission hole on the substrate have substantially a same shape, and have substantially a same area.

8. The display panel of claim 7, wherein orthographic projections of the first light transmission hole, the second light transmission hole corresponding to the first light transmission hole, and the third light transmission hole corresponding to the first light transmission hole on the substrate at least partially overlap each other.

9. The display panel of claim 8, wherein orthographic projections of the first light transmission hole and the second light transmission hole corresponding to the first light transmission hole on the substrate completely overlap each other; and
orthographic projections of the first light transmission hole and the third light transmission hole corresponding to the first light transmission hole on the substrate at least partially overlap each other.

10. The display panel of claim 9, wherein a region where orthographic projections of the first light transmission hole and the third light transmission hole corresponding to the first light transmission hole on the substrate overlap each other has a square shape.

11. The display panel of claim 9, wherein orthographic projections of the first light transmission hole, the second light transmission hole corresponding to the first light transmission hole, and the third light transmission hole corresponding to the first light transmission hole on the substrate are respectively a first orthographic projection, a second orthographic projection and a third orthographic projection;
the first orthographic projection, the second orthographic projection and the third orthographic projection have substantially a same area and have a shape of a square, and one of any two sides intersecting with each other of the square extends along a first direction, and the other one extends along a second direction; and
distances between a center of the first orthographic projection and a center of the third orthographic projection in the first direction and in the second direction are equal to each other.

12. The display panel of claim 11, wherein side lengths of the first orthographic projection, the second orthographic projection and the third orthographic projection are all D, the distances between the center of the first orthographic projection and the center of the third orthographic projection in the first direction and in the second direction are all T, a thickness of the light path structure is H, and a collimation light-receiving angle θ of the light transmission channel in the light path structure satisfies:

$$\theta=\arctan((D-T)/H),$$

where D ranges from 4 μm to 10 μm; T ranges from 1 μm to 3 μm; and
the collimation light-receiving angle θ ranges from 10° to 20°.

13. The display panel of claim 12, wherein the first light transmission holes, the second light transmission holes, and the third light transmission holes are arranged at an identical arrangement period of P, a thickness of the first light shielding layer is h1, a thickness of the second light shielding layer is h2, a thickness of the third light shielding layer is h3, a thickness of the light transmission layer between the first light shielding layer and the third light shielding layer is H1, and a thickness of the light transmission layer between the second light shielding layer and the third light shielding layer is H2, D, T, H, P, h1, h2, h3, H1, H2 satisfy:

$$H/(P+D)\leq(h1+h3+H1)/(D+T)\leq(h2+H2)/(P-T).$$

14. The display panel of claim 13, wherein
P ranges from 5 μm to 20 μm;
h1 ranges from 1 μm to 3 μm;
h2 ranges from 1 μm to 3 μm;
h3 ranges from 1 μm to 3 μm;
H1 ranges from 0.5 μm to 4 μm; and
H2 ranges from 0.5 μm to 4 μm.

15. The display panel of claim 1, further comprising a pixel definition layer which is on a side of the second planarization layer distal to the substrate, wherein
the pixel definition layer has a pixel opening, the light emitting layer is in the pixel opening, the second electrode is on a side of the pixel definition layer distal to the substrate, and a material of the pixel definition layer comprises a light shielding material; and
the pixel definition layer is multiplexed as the second light shielding layer.

16. The display panel of claim 15, further comprising a filter layer which is between the second electrode and the pixel definition layer, and fills the second light transmission hole in the pixel definition layer, and the filter layer is configured to filter out non-visible light.

17. The display panel of claim 15, further comprising a filter layer which is between the first light shielding layer and the second light shielding layer, and is configured to filter out non-visible light; wherein
the filter layer is multiplexed as at least one light transmission layer.

18. The display panel of claim 17, further comprising a filling layer which is between the second electrode and the pixel definition layer, and fills the second light transmission holes in the pixel definition layer, wherein a spacer dam surrounding the pixel opening is between the filling layer and the second electrode; or further comprising a spacer dam which is between the second electrode and the pixel definition layer, fills the second light transmission holes in the pixel definition layer and surrounds the pixel opening.

19. The display panel of claim 15, wherein at least one third light shielding layer is between the first light shielding layer and the second light shielding layer, and a material of the third light shielding layer comprises a black resin material or a metal material.

20. The display panel of claim 19, further comprising a second passivation layer which is between the third light shielding layer and the light transmission layer on a side of the third light shielding layer proximal to the substrate and closest to the third light shielding layer.

21. The display panel of claim 20, wherein
the driving circuit layer comprises an active layer, a first gate insulating layer, a first gate conductive layer, a second gate insulating layer, a second gate conductive layer, an interlayer dielectric layer, a first source drain conductive layer, and a first planarization layer, which are sequentially stacked along a direction distal to the substrate; and a second source drain conductive layer is on a side of the first planarization layer distal to the substrate, and comprises the third electrode; and
the display panel further comprises:
an encapsulation layer and a cover plate which are on a side of the second electrode distal to the substrate, wherein the cover plate is on a side of the encapsulation layer distal to the substrate; and
a touch functional layer or a circular polarizer which is between the encapsulation layer and the cover plate.

22. The display panel of claim 1, wherein the photoelectric sensing structure comprises a plurality of photoelectric sensors, an orthographic projection of a photoelectric sensor of the plurality of photoelectric sensors on the substrate does not overlap an orthographic projection of a corresponding light emitting element of the plurality of light emitting elements on the substrate;
the substrate comprises a plurality of first pixel regions in an array and a plurality of second pixel regions in an array, and the first pixel regions and the second pixel regions are alternately provided in a row direction and a column direction; and
the light emitting element is in the first pixel region, and the photoelectric sensor is in the second pixel region.

* * * * *